(12) United States Patent
Tran et al.

(10) Patent No.: US 6,437,233 B1
(45) Date of Patent: Aug. 20, 2002

(54) SOLAR CELL HAVING MULTI-QUANTUM WELL LAYERS TRANSITIONING FROM SMALL TO LARGE BAND GAPS AND METHOD OF MANUFACTURE THEREFOR

(75) Inventors: Dean Tran, Westminster; George J. Vendura, Jr., Rossmoor; William L. Jones, Inglewood; Edward A. Rezek, Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/624,815

(22) Filed: Jul. 25, 2000

(51) Int. Cl.⁷ ............................ H01L 31/04; H01L 31/06
(52) U.S. Cl. .................. 136/249; 136/255; 136/258; 136/261; 136/262; 257/53; 257/438; 257/461; 438/96; 438/87; 438/74; 438/91
(58) Field of Search .................. 136/249 TJ, 255, 136/258 AM, 261, 262; 257/53, 438, 461; 438/96, 87, 74, 91

(56) References Cited

U.S. PATENT DOCUMENTS 2,949,498 A * 8/1960 Jackson ...................... 136/244
3,496,024 A * 2/1970 Ruehrwein .................. 136/255
4,634,641 A * 1/1987 Nozik ........................ 429/111
4,688,068 A * 8/1987 Chaffin et al. .............. 136/249
5,496,415 A * 3/1996 Barnham .................... 136/255
6,147,296 A * 11/2000 Freundlich .................. 136/255
6,150,604 A * 11/2000 Freundlich et al. ......... 136/255
6,166,320 A * 12/2000 Nagashima et al. ........ 136/249

FOREIGN PATENT DOCUMENTS

GB          2083701 A      *  3/1982

* cited by examiner

Primary Examiner—Alan Diamond
(74) Attorney, Agent, or Firm—Robert W. Keller

(57) ABSTRACT

A solar cell comprises a superstrate formed from a material that is transparent to light, a first layer formed of delta doped silicon, a plurality of layers formed from semiconductor materials, each characterized by multi-quantum wells and multiple band gaps, a first semiconductor layer having a band gap energy state that is the smallest, the last semiconductor layer having a band gap that is the largest, and the intermediate semiconductor layers having band gaps transitioning from the smallest to the largest, a second layer overlying the semiconductor layers and formed of delta doped silicon, an n-cap layer formed on the second delta doped layer, and a metal layer formed on the n-cap layer and serving to reflect light into the semiconductor.

18 Claims, 2 Drawing Sheets

SOLAR CELL HAVING MULTI-QUANTUM WELL LAYERS TRANSITIONING FROM SMALL TO LARGE BAND GAPS AND METHOD OF MANUFACTURE THEREFOR

BACKGROUND OF THE INVENTION

1. Field of the Invention

The present invention relates to a solar cell, and, more particularly, to a solar cell having semiconductor layers with multi-quantum wells that transition from a small band gap energy state to a large band gap energy state, and a method of manufacture.

2. Description of the Prior Art

Satellites and space stations require light weight, high power solar cells. The conventional solar cell comprises a p-n junction formed from a crystalline semiconductor material, which determines a single band gap energy state. When photons having an energy state greater than the band gap energy state are incident on the solar cell, electrons at the p-n junction absorb the energy and move to a higher energy state. This produces electron-hole pairs. An electromagnetic field produced by the voltage associated with the p-n junction causes the electron-hole pairs to move, thus producing a photocurrent. Accordingly, the solar cell converts the incident light energy into electrical energy.

Typically the solar cell is formed from crystalline silicon and has a deep junction. Such a solar cell is extremely responsive to longer wavelength light and exhibits much less response to shorter wavelength light. It achieves an efficiency of approximately 18%. However, in outer space shorter wavelength light predominates. Hence, in another embodiment the single p-n junctions are made closer to the surface and thinner to enable the solar cell to respond more efficiently to the shorter wavelength light. In still other embodiments, solar cells are made with double junctions and from crystalline gallium arsenide and gallium indium arsenide in attempts to create more efficient energy converters. A triple junction gallium arsenide device was recently developed by Spectrolab Inc. and is alleged to have an efficiency of 26.8%.

What is needed, therefore, is a solar cell that efficiently converts more light of all wavelengths in the light spectrum, or photonic energy, into electrical energy and is relatively light weight. In addition, it is desirable to develop a process for manufacturing this more efficient solar cell.

SUMMARY OF THE INVENTION

The preceding and other shortcomings of the prior art are addressed and overcome by the present invention which provides generally, in a first aspect, a solar cell comprising a superstrate material that is transparent to light, coated with a plurality of layers formed from semiconductor materials characterized by multi-quantum wells and multiple band gaps. The first band gap has the smallest, and the last layer has the largest band gap, and the intermediate layers have band gaps transitioning from the smallest to the largest. The overlapping band tails between adjacent layers eliminate the need for a tunneling junction. Also, the use of amorphous materials is advantageous because they are less susceptible to degradation upon long term exposure to radiation.

In another aspect, the present invention provides a two dimensional electron gas interface layer in addition to the regular p-n junction. In this case, p and n layer interfaces are highly doped with silicon (delta doped) to form atomic layers that saturate with electrons to reduce the interface electron-hole recombination.

In yet another aspect, the present invention provides a method of fabricating a solar cell comprising: providing a glass superstrate having a layer of conductive transparent oxide, and forming a plurality of layers of semiconductive materials on that oxide, the materials characterized by multi-quantum wells and multiple band gaps, the layers transitioning from a first layer formed from a material having the smallest band gap, such as indium antimonide, to a last layer formed from a material having the largest band gap energy state, such as indium arsenide, indium gallium arsenide, indium phosphide, indium gallium arsenide phosphide, gallium arsenide or silicon.

The foregoing and additional features and advantages of this invention will become apparent from the detailed description and accompanying drawing figures below. In the figures and the written description, numerals indicate the various elements of the invention, like numerals referring to like elements throughout both the drawings and the written description.

DETAILED DESCRIPTION OF THE PREFERRED EMBODIMENT

Figure 1:
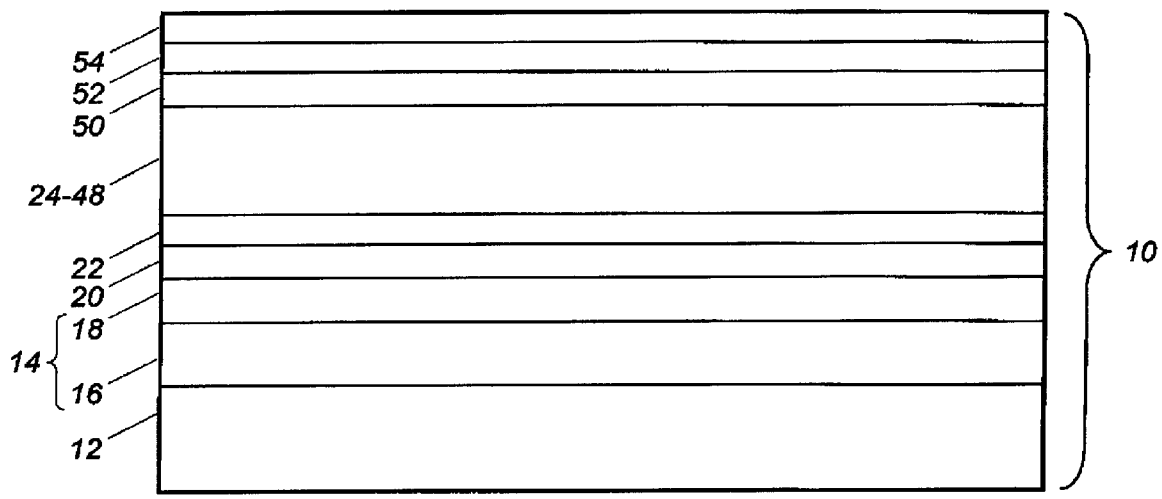
FIG. 1 is a cross section of the solar cell in accordance with the present invention.

As illustrated in the block diagram of FIG. 1, the present invention provides a solar cell, generally designated by the numeral 10. Briefly, the solar cell 10 comprises a superstrate 12, also referred to as a carrier or substrate, formed from clear transparent glass and having a flat outer surface. The superstrate 12 is thin, preferably with a thickness of between 3 and 12 mils, and is square shaped in plan view having a side dimension of between 3 and 24 inches. The glass type can be Asahi, TCMX, VCMX, GCMX or others of this nature.

A light diffusion layer 14 is grown on the superstrate 12 at a temperature of between 450 and 600° C. The superstrate 12 is preannealed at the growth temperature. The layer 14 comprises a binder layer 16 of silicon dioxide grown at a pressure between 1.5 and 1.8 psi and a tin oxide layer 18 grown at a pressure of approximately 0.25 psi, and includes tin tetrachloride, nitrogen gas for dilution purposes, methanol for carbon doping, and hydrogen fluoride that serves as a fluoride dopant for providing conductive properties. The layer 14 is generally between 0.15 and 0.25 $\mu$m thick and is also referred to as a conductive transparent oxide (CTO).

Next a p-layer 20 of amorphous silicon is deposited on layer 18. This layer contains carbon that is doped with boron or zinc. The p-layer 20 is approximately 0.1 $\mu$m thick and serves as the surface recombination-reduction layer for charge carriers and as the layer that provides an electrical contact to the solar cell. The p-layer is grown in an environment of silane, methanol, and trimethyl boron (TMB). Alternatively, dimethyl zinc or triethyl boron may be used to supply the p-type dopant. Someone skilled in the art will recognize that other metal organic gases with similar characteristics may also be used. The growth takes place at a temperature between 200 and 300° C. and a pressure between 0.3 and 1.4 torr.

Throughout this specification it should be understood that deposition is preferably a low pressure metal organic chemical vapor deposition, (LPMOCVD). Alternatively, an atmospheric pressure MOCVD (APMOCVD) process may be utilized.

A two dimensional (2D) electron gas interface layer 22 of delta doped silicon is next deposited. At the p+/n− junction, this reduces the electron-hole recombination resulting in the high free carrier concentrations in this region. The layer 22 is extremely thin (almost a mono-atomic layer) and has a thickness between 10 and 30 Å. It is grown at a temperature between 200 and 300°C., at a pressure between 0.5 and 2.0 torr and is formed with silane, nitrogen as a dilution gas, and hydrogen as its source chemicals.

Thereafter multiple layers are formed from semiconductor materials, each characterized by multi-quantum wells and a characteristic band gap. These provide the active region of the solar cell. For simplicity, the layers 24–48 are shown as a single semiconductor layer in FIG. 1. As will be described in more detail subsequently and with reference to Chart 1, the first semiconductor layer 24 has a band gap that is the largest of the semiconductor layers, the intermediate layers 26 through 46, have decreasing band gaps, and the last semiconductor layer 48 has the smallest band gap energy state. Correspondingly, the cut-off wavelength of each subsequent semiconductor layer increases over the cut-off wavelength of its underlying layer. Each interface between layers constitutes a p-n junction or inserts an intrinsic space layer.

semiconductor deposited on the interface layer 22 (see FIG. 1). Layer 48 is the last semiconductor layer deposited.

For each semiconductor layer, deposition occurs at a temperature of typically between 250 and 500° C. In each case the layer has a-critical thickness that maximizes light absorption and minimizes the resistivity across the layer. Algebraically this critical thickness is equal to $1/\alpha$ where a is the optical absorption coefficient of that layer. For thicknesses greater than the critical thickness, a mismatch in coefficients of reflection occur and for lesser thicknesses it is difficult to control exactly the dimension.

Full chemical names represented by the initials in the last column of Chart 1 are as follows:

TEG=Triethyl Gallium
TEAs=Triethyl Arsenide
TESb=Triethyl Antimonide
DESn=Diethyl Tin
TMG=Trimethyl Gallium
TEI=Triethyl Indium
TMSb=Trimethyl Antimonide
DMSn=Dimethyl Tin
PH3=Phosphine
AsH3=Arsine
TMAs=Trimethyl Arsenide
TMTe=Trimethyl Telluride
TMI=Trimethyl Indium
TETe=Triethyl Telluride Chart 1

| Layer Number | Material | Eg (300), eV | Cut-off λ | Deposition Chemical Sources * |
|---|---|---|---|---|
| | $Ga_xIn_{1-x}As$: Te or Sn | $0.356 + 0.7x + 0.4x^2$ (x = 0.02 to 0.20) | | TMG + TEI + AsH3 or TEG + TMI + TMAs Doping: Te uses TMTe or TETe; Sn uses TMSn or TESn |
| | 2D electron Gas: Si delta dope | May not need | | Silane + N2 + H2 |
| 48 | InSb | 0.17 | 7.405882353 | TEI + TESb |
| 46 | $InAs_xSb_{1-x}$ | $0.17 + 0.19x$ (x = 0.0 to 1.0) | | TEI + TESb + AsH3 |
| 44 | InAs | 0.36 | 3.497222222 | TEI + AsH3 + TMI + TMAs |
| 42 | $Ga_xIn_{1-x}As$ | $0.356 + 0.7x + 0.4x^2$ (x = 0.0 to 0.42) | | TMG + TEI + AsH3 |
| 40 | GaSb | 0.72 | 1.748611111 | TMG + TMSb + TEG + TE2b + TMAs |
| 38 | $Ga_xIn_{1-x}As$ | $0.356 + 0.7x + 0.4x^2$ (x = 0.42 to 0.76) | | TMG + TEI + AsH3 + TEG + TMI |
| 36 | Si | 1.12 | 1.124107143 | SiH3 + $CH_3OH$ + H2 + N2 |
| 34 | $Ga_xIn_{1-x}As$ | $0.356 + 0.7x + 0.4x^2$ (x = 0.76 to 0.93) | | MTG + TEI + AsH3 |
| 32 | InP | 1.35 | 0.932592593 | TEI + PH3 |
| 30 | $Ga_xIn_{1-x}P$ | $1.34 + 0.511x + 0.6043x2$ (x = 0.02 to 0.14) | | TMG + TEI + PH3 |
| 28 | GaAs | 1.42 | 0.886619718 | TMG + AsH3 or TEG + AsH3 or TMG + TEAs |
| 26 | $Ga_xIn_{1-x}P$ | $1.34 + 0.511x + 0.6043x^2$ (x = 0.14 to 0.88) | | TMG + TEI + PH3 |
| 24 | GaP | 2.26 | 0.557079646 | TMG + PH3 |

Reference is now made of Chart 1 below which shows the undoped semiconductor layer material, its energy gap (Eg) in electron volts, its cut-off wavelength, and the metal organic chemical sources to produce the material. The left hand column shows the layer number, namely 24–46, with layer 24 depicted at the bottom of Chart 1 since it is the first As shown, the solar cell structure incorporates multiple quantum wells of various band gap semiconductor materials, transitioning from a small band gap, e.g., indium antimonide (InSb), layer 48 proximate a metal cap layer 54 (shown in FIG. 1) to a larger band gap, e.g., indium arsenide (InAs), layer 44; gallium indium arsenide (GaInAs), layer 42; silicon (Si) layer 36; indium phosphide (InP) layer 32; and gallium arsenide (GaAs) layer 28. The material having the largest band gap, e.g., GaP, layer 24, is proximate the glass superstrate 12.

Following the deposition of the 13 amorphous semiconductive layers, a two dimensional electron gas interface layer 50 of delta doped silicon is deposited. Preferably the layer 50 is extremely thin, between 10 and 30 angstroms in thickness. It reduces interface recombination and hence yields the high free carrier concentration region. It is similar to layer 22. It is grown at a temperature between 200 and 300° C. and at a pressure between 0.5 and 2.0 torr.

Thereafter, an n cap layer 52 is deposited. It comprises indium gallium arsenide doped with either tellurium (Te) or antimony (Sb) and is approximately 0.1 $\mu$m thick and serves as an electrical contact layer for the solar cell.

Finally, the metal layer 54 is deposited, preferably of aluminum (Al). This is the n contact metal layer and is at least 500 nm thick. It functions as a reflective mirror for the light incident on the glass superstrate 12 and passing through the layers 14–52, and also as an electrical contact for conducting the electrical energy or photonic current produced by the solar cell 10. To finalize the manufacturing process, the solar cell goes through the conventional processing steps of scribing, etching, cleaning, annealing, electrical curing and module characterization. Aluminum oxidizes during the subsequent laser scribing step to become aluminum oxide, $Al_2O_3$, and the residual aluminum bridges that may form during manufacturing that would tend to reduce power output are easily burned out during electrical curing, thereby opening the circuit. Alternatively, other combinations of metals (Ag/ZnO/Al/Ag) may be used.

In operation light rays incident on the glass superstrate 12 pass through the glass. The light rays which have an energy that is less than the band gap energy of the layer encountered will be absorbed into the layer and converted into electrical current or energy. Any light rays that have an energy greater than that layer's band gap energy will pass through that layer into the next layer.

Each semiconductor layer has a different index of reflection. Hence, although light energy is absorbed in the layer, there are some light rays that have energy close to the edge of the band gap and thus will not be totally absorbed. These light rays reflect at the interfaces between the layers, due to the different is indices of reflection, and are bound back into the layer. Hence, they oscillate. This causes the light to resonate within the layer. Thus, each layer absorbs a band of light having a predetermined range of wavelengths. During this process, as the incident light proceeds through the layers, the light rays are continuously trapped, absorbed and thus converted into electrical energy. As described, the low energy light is absorbed first and the higher energy light passes through to successive layers. Because of the selected responsivity to light of different wavelengths by each layer, the total stack of layers absorb the full spectrum of light, from ultraviolet to infrared, and convert them into electrical energy. Hence the solar cell in accordance with the present invention is very efficient.

Figure 2:
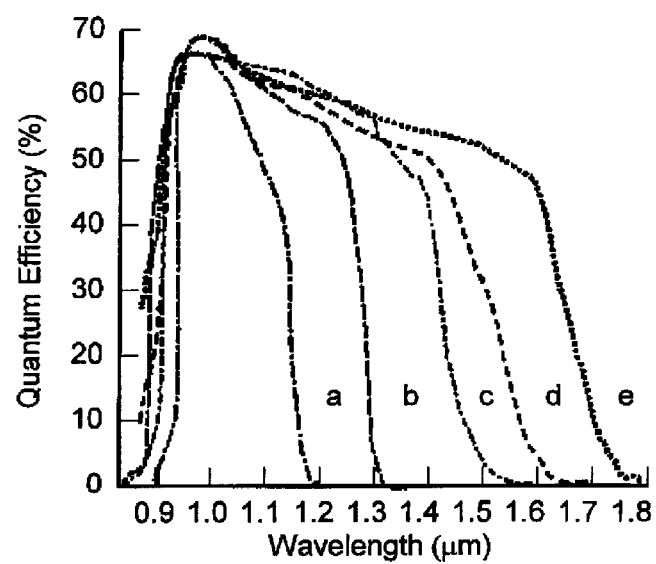
FIG. 2 is a graph depicting plots of quantum efficiency versus wavelength for several semiconductor materials in accordance with the present invention.
Figure 3:
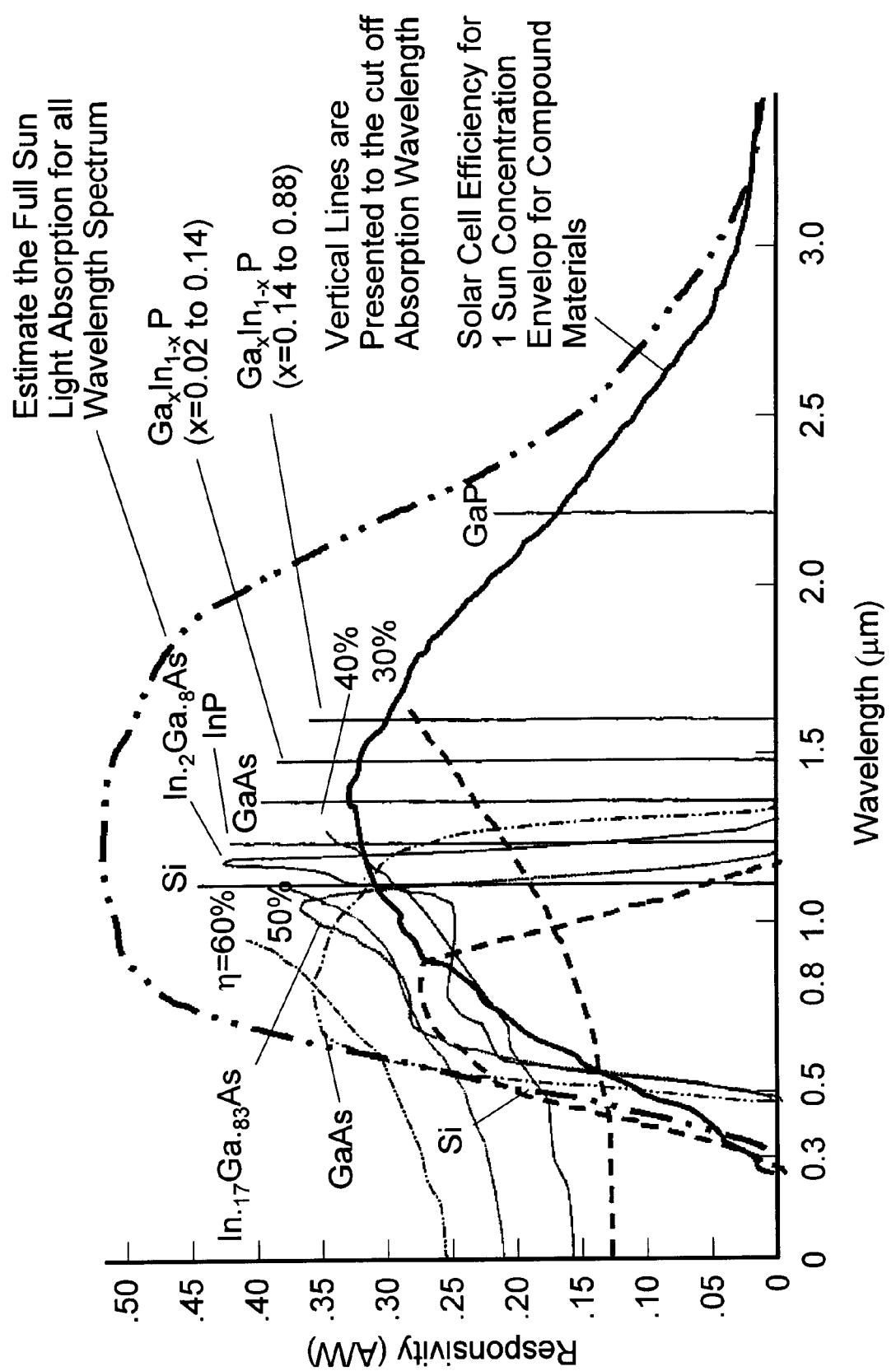
FIG. 3 is a graph depicting responsivity versus wavelength for several semiconductor materials and for several constant quantum efficiency values in accordance with the present invention.

To describe this, reference is made to FIG. 2 and FIG. 3. FIG. 2 shows graphs of quantum efficiency versus wavelength for five compositions of indium gallium arsenide phosphide semiconductor materials, a, b, c, d and e. These are all variations of the following formula:

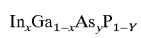

$$In_xGa_{1-x}As_yP_{1-Y}$$

in which x and y are defined as follows:

Chart 2

|   | x    | y    |
|---|------|------|
| a | 0.22 | 0.53 |
| b | 0.28 | 0.39 |
| c | 0.31 | 0.34 |
| d | 0.41 | 0.12 |
| e | 0.47 | 0.00 |

Note that the range of wavelengths on the abscissa in FIG. 2 from 0.8 to 1.8 $\mu$m partly covers the spectrum of sunlight. As is well known, the sunlight goes from ≅0.3 $\mu$m to over 2$\mu$m and it can be seen in FIG. 2 that the strongest signals occur at <0.8$\mu$m. and also the materials cut-off wavelength increases as x increases and y decreases. In particular, material a has a cut-off wavelength of approximately 1.2$\mu$m and material e has a cut-off wavelength of approximately 1.7 $\mu$m. Also, each of the materials can achieve a quantum efficiency of 60% for an appreciable range of wavelengths, and has an efficiency of ≧50% for almost its entire wavelength bandwidth.

Also, FIG. 3 shows graphs of responsivity (A/W) versus wavelength for gallium arsenide (GaAs), silicon (Si) and two compositions of indium gallium arsenide for quantum efficiencies equal to 30%, 40%, 50% and 60%. A reference graph illustrates solar cell efficiency for 1 sum concentration envelop for compound materials and can be used for comparison purposes. Vertical lines depict the cut-off absorption wavelength for the 6 particular compositions noted in FIG. 3. As can be seen, the cut-off wavelength of gallium arsenide is greater than that of silicon. Also, the cut-off wavelength of the indium gallium arsenide compositions shown are greater than those for silicon or gallium arsenide. As described above, the ternary materials, such as indium gallium arsenide (GaInAs) or gallium indium phosphide (GaInP), exhibit a change in their cut-off wavelength when their composition changes. Hence, by changing the formulation or composition of a material, its cut-off wavelength will also change. This cut-off wavelength form can hence be selected to be short or long.

From FIG. 2 and FIG. 3 it should be recognized that a fuller spectrum of wavelengths will be absorbed by a stack of different layers consisting of these different materials.

Accordingly, a solar cell having increased energy conversion efficiency and formed upon an ultra-thin glass superstrate with multiple junctions has been provided. It is extremely useful for space applications and provides an increased power to weight ratio. The solar cell is characterized by reduced tunneling because, of the stacked junctions, increased shunt resistance, reduced leakage current, and increased efficiency.

Although the invention has been described using 13 semiconductive layers between a glass substrate and a metal cap, one skilled in the art should recognize that the structure and process may have more or fewer layers. The individual steps which make up this novel method of manufacture are not in themselves new. However, their application in combination to create the transitioned band gap structure is both new and novel.

What has been described is at present considered to be the preferred embodiment of the invention. However, it will be understood that various modifications may be made therein, and it is intended to cover in the appended claims all such modifications as fall within the true spirit and scope of the invention.

What is claimed is:

1. A solar cell comprising:
   a superstrate formed from a material that is transparent to light;
   a plurality of layers formed from semiconductor materials, each of said plurality of semiconductor layers characterized by multi-quantum wells and a characteristic bandgap, a first layer of said semiconductor layers overlying said superstrate and having a bandgap that is the smallest, the last layer having the largest bandgap energy state and the intermediate layers having bandgaps transitioning from the smallest to the largest; and
   a layer formed of delta doped silicon between said superstrate and the first layer of semiconductive material.

2. A solar cell composing:
   a superstrate formed from a material that is transparent to light;
   a plurality of layers formed from semiconductor materials, each of said plurality of semiconductor layers characterized by multi-quantum wells and a characteristic bandgap, a first layer of said semiconductor layers overlying said superstrate and having a bandgap that is the smallest, the last layer having the largest bandgap energy state and the intermediate layers having bandgaps transitioning from the smallest to the largest; and
   wherein the first layer comprises gallium phosphide, an Intermediate layer comprises silicon and a later layer comprises indium antimonide.

3. A solar cell comprising:
   a superstrate formed from a material that is transparent to light;
   a first layer overlying said superstrate and formed of delta doped silicon;
   a plurality of layers formed from semiconductor materials, each of said plurality of semiconductor layers characterized by multi-uantum wells and a characteristic bandgap, a first semiconductor layer having a bandgap energy state that is the smallest, the last semiconductor layer having a bandgap that is the largest, and the intermediate semiconductor layers having bandgaps transitioning from the smallest to the largest; and
   a second layer overlying the semiconductor layers and formed of delta doped silicon.

4. The solar cell as set forth in claim 3 and further comprising an n-cap layer formed on the second delta doped silicon layer.

5. The solar cell as set forth in claims 4 and further comprising a metal layer formed on said n-cap layer, said metal layer serving to reflect light into the semiconductor layers.

6. A method of fabricating a solar cell comprising:
   providing a glass superstrate having a layer of conductive transparency oxide; and
   forming a plurality of layers of semiconductive materials on the oxide, each of said materials characterized by multi-quantum wells and a characteristic bandgap, said layers transitioning from a first layer having the smallest bandgap to a last layer having the largest bandgap.

7. The method as recited in claim 6 wherein the layers are formed by deposition.

8. The method as set forth in claim 6 wherein at least three layers of semiconductive materials are formed.

9. The method as set forth in claim 6 wherein each layer of semiconductive material absorbs a particular band of light between the infrared and ultraviolet regions.

10. The method as set forth in claim 6 wherein at least one of the semiconductor layers are formed from an amorphous material.

11. The method as set forth in claim 6 wherein the thickness of each semiconductor layer is selected to maximize light absorption and minimize resistivity across the layer.

12. The method as set forth in claim 7 wherein the layers are deposited by low pressure metal oxide chemical vapor deposition.

13. The method as set forth in claim 7 wherein the layers are deposited by atmospheric pressure metal organic chemical vapor deposition (APMOCVD).

14. The method as set forth in claim 6 wherein the first semiconductor layer comprises gallium phosphide, a second semiconductor layer comprises gallium indium phosphide, a third semiconductor layer comprises gallium arsenide and a fourth layer comprises gallium indium phosphide.

15. The method as set forth in claim 14 wherein a fifth semiconductor layer comprises indium phosphide.

16. The method as set forth in claim 6 wherein the first semiconductor layer comprises gallium phosphide, an intermediate semiconductor layer comprises silicon:carbon, and a later semiconductor layer comprises indium antimonide.

17. A method of fabricating a solar cell comprising:
    providing a glass superstrate having a layer of conductive transparency oxide;
    forming a layer of delta doped silicon electron gas on the oxide to reduce the recombination of electrons and holes; and
    forming a plurality of layers of semiconductive materials on the oxide, each of said materials characterized by multi-quantum wells and a characteristic bandgap, said layers transitioning from a first layer having the smallest bandgap to a last layer having the largest bandgap.

18. A method of fabricating a solar cell comprising:
    providing a glass superstrate having a layer of conductive transparency oxide;
    forming a plurality of layers of semiconductive materials on the oxide, each of said materials characterized by multi-quantum wells and a characteristic bandgap, said layers transitioning from a first layer having the smallest bandgap to a last layer having the largest bandgap and
    wherein the first semiconductor layer is gallium phosphide.

* * * * *